United States Patent
Kobayashi et al.

(10) Patent No.: US 11,994,798 B2
(45) Date of Patent: May 28, 2024

(54) RESIST MATERIAL AND PATTERNING PROCESS

(71) Applicant: SHIN-ETSU CHEMICAL CO., LTD., Tokyo (JP)

(72) Inventors: Tomohiro Kobayashi, Joetsu (JP); Tsukasa Watanabe, Joetsu (JP); Hiroki Nonaka, Joetsu (JP); Seiichiro Tachibana, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 327 days.

(21) Appl. No.: 16/937,716

(22) Filed: Jul. 24, 2020

(65) Prior Publication Data
US 2021/0063871 A1    Mar. 4, 2021

(30) Foreign Application Priority Data
Aug. 30, 2019  (JP) .................. 2019-158746

(51) Int. Cl.
G03F 7/004   (2006.01)
G03F 7/16    (2006.01)
G03F 7/20    (2006.01)
G03F 7/32    (2006.01)

(52) U.S. Cl.
CPC .......... G03F 7/0042 (2013.01); G03F 7/0045 (2013.01); *G03F 7/168* (2013.01); *G03F 7/2004* (2013.01); *G03F 7/2037* (2013.01); *G03F 7/325* (2013.01)

(58) Field of Classification Search
CPC ...... G03F 7/0042; G03F 7/0045; G03F 7/168; G03F 7/2004; G03F 7/2037; G03F 7/325; G03F 7/0048; G03F 7/26; G03F 7/32
See application file for complete search history.

(56) References Cited

U.S. PATENT DOCUMENTS

| | | | | |
|---|---|---|---|---|
| 7,537,880 | B2 * | 5/2009 | Harada ................. | G03F 7/0397 430/326 |
| 9,310,684 | B2 | 4/2016 | Meyers et al. | |
| 2003/0059544 | A1 * | 3/2003 | Bravo-Vasquez ........................ | C23C 18/1279 427/508 |
| 2006/0006541 | A1 * | 1/2006 | Tsuchiya ........... | H01L 21/02216 252/573 |
| 2009/0136869 | A1 * | 5/2009 | Ogihara ................ | G03F 7/0752 430/316 |
| 2012/0208125 | A1 * | 8/2012 | Hatakeyama ......... | G03F 7/0043 430/296 |
| 2012/0208127 | A1 | 8/2012 | Hatakeyama | |
| 2013/0029270 | A1 * | 1/2013 | Hatakeyama ......... | G03F 7/0392 430/296 |
| 2014/0087066 | A1 * | 3/2014 | Wang ..................... | G03F 7/094 427/126.3 |
| 2015/0086926 | A1 * | 3/2015 | Ohashi ................. | C07C 69/635 430/285.1 |
| 2015/0099228 | A1 * | 4/2015 | Hatakeyama ......... | G03F 7/0043 430/326 |
| 2017/0102612 | A1 | 4/2017 | Meyers et al. | |
| 2018/0158723 | A1 * | 6/2018 | Srivastava .............. | G03F 7/095 |
| 2018/0364570 | A1 | 12/2018 | Hatakeyama et al. | |
| 2019/0258161 | A1 * | 8/2019 | Sakai .................... | G03F 7/0042 |
| 2019/0265592 | A1 * | 8/2019 | Konoshima .............. | H01B 1/22 |
| 2020/0218161 | A1 | 7/2020 | Serizawa et al. | |

FOREIGN PATENT DOCUMENTS

| | | | | |
|---|---|---|---|---|
| CN | 1151752 | A * | 6/1997 | .......... C09D 183/14 |
| JP | 2006344479 | A * | 12/2006 | |
| JP | 2008-111103 | A | 5/2008 | |
| JP | 2012-185485 | A | 9/2012 | |
| JP | 2014-197171 | A | 10/2014 | |
| JP | 5708521 | B2 | 4/2015 | |
| JP | 5708522 | B2 | 4/2015 | |
| JP | 6119544 | B2 | 4/2017 | |
| JP | 2019-144542 | A | 8/2019 | |
| TW | 201638664 | A | 11/2016 | |
| TW | 201904940 | A | 2/2019 | |
| TW | 201921154 | A | 6/2019 | |
| WO | WO-2012029734 | A1 * | 3/2012 | .......... G03F 7/0226 |
| WO | WO-2014013986 | A1 * | 1/2014 | ............ C08G 77/04 |
| WO | 2016/140057 | A1 | 9/2016 | |
| WO | 2018/025738 | A1 | 2/2018 | |

OTHER PUBLICATIONS

Apr. 27, 2021 Office Action issued in Taiwanese Patent Application No. 109129240.
Stowers, Jason et al., "Directly patterned inorganic hardmask for EUV lithography" proc. of SPIE, vol. 7969, pp. 796915-1-11, 2011.
N. Tohge, "Effects of UV-irradiation on the Formation of Oxide Thin Films from Chemically Modified Metal-Alkoxides", Journal of Sol-Gel Science and Technology, 2, (pp. 581-585) (1994).
Jul. 20, 2022 Office Action issued in Japanese Application No. 2019-158746.
Jul. 28, 2022 Office Action issued in Korean Application No. 2020-0099015.

* cited by examiner

*Primary Examiner* — Mark F. Huff
*Assistant Examiner* — Moriah S. Smoot
(74) *Attorney, Agent, or Firm* — Oliff PLC

(57) ABSTRACT

The present invention is a resist material containing: (i) a metal compound shown by the following general formula (M-1) and (ii) an organic solvent. An object of the present invention is to provide a metal-containing resist material having high sensitivity and high resolution particularly in EUV and electron beam lithography; and a patterning process using this material.

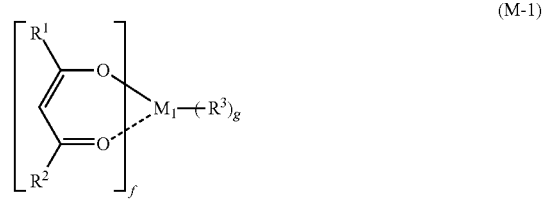

(M-1)

9 Claims, No Drawings

RESIST MATERIAL AND PATTERNING PROCESS

TECHNICAL FIELD

The present invention relates to: a resist material, in particular, a resist material for electron beam (EB) exposure and vacuum ultraviolet ray (EUV) exposure; and a patterning process using this resist material.

BACKGROUND ART

As LSIs advance toward higher integration and higher processing speed, miniaturization of pattern rule is progressing rapidly. As a cutting-edge technology for miniaturization, ArF immersion lithography is applied to mass production of devices after 45-nm node. Furthermore, together with ArF immersion exposure, double exposure (double patterning) process has been put to practical use in generations after 28-nm node, and it has become possible to form narrow-pitch patterns that exceed an optical limit.

Furthermore, in production of devices after 20-nm node, study is being conducted on a multiple exposure (multiple patterning) process by which patterns with a narrower pitch are formed by repeating exposure and etching three times or more.

However, since the number of steps is increased in a multiple exposure process, productivity is lowered due to lengthening of production period and the increased frequency of defect generation, and a situation arises that cost is significantly raised.

In recent years, as an effective technology to take the place of a combination of ArF immersion lithography and multiple exposure process, vacuum ultraviolet ray (EUV) lithography with a wavelength of 13.5 nm is attracting attention. By using this technology, it has become possible to form a fine pattern with a half pitch of 25 nm or less in one exposure.

Meanwhile, in EUV lithography, higher sensitivity in a resist material is strongly required to compensate for insufficient output of a light source. However, increase in shot noise that accompanies higher sensitization leads to increase in edge roughness (LER and LWR) of line patterns, and compatibility of higher sensitization and low edge roughness is given as an important problem in EUV lithography.

As an attempt to achieve higher sensitivity of a resist or to lower the influence of shot noise, it has been considered in recent years to use a metal material in a resist material. A compound that contains a metallic element such as barium, titanium, hafnium, zirconium, or tin has a higher absorbance of EUV light compared to an organic material that does not contain metal, and improvement of photosensitivity of resists and suppression of the influence of shot noise can be expected. Furthermore, a metal-containing resist pattern is expected to achieve a high-selectivity etching process by combining with an underlayer film made from a non-metal material.

For example, a resist material with added metal salt or organometallic complex described in Patent Documents 1 and 2, or a non-chemically amplified resist material that uses nanoparticles of metal oxide described in Patent Documents 3, 4, and Non Patent Document 1 are considered.

In particular, titanium is attracting attention as an industrially useful metal, since it is easily obtained, having a relatively high Clarke number, and furthermore, has low toxicity. An application of an organic titanium compound to a resist includes Patent Document 5, and by utilizing a condensate of an organic titanium compound, improvement of resolution performance in electron beam drawing has been successfully achieved.

However, the resolution of these metal-containing resists have not yet reached the level considered necessary for practical use, and further improvement of resolution is required.

CITATION LIST

Patent Literature

Patent Document 1: Japanese Patent No. 5708521
Patent Document 2: Japanese Patent No. 5708522
Patent Document 3: U.S. Pat. No. 9,310,684
Patent Document 4: United States Patent Application Publication No. 2017/0102612
Patent Document 5: Japanese Patent No. 6119544

Non-Patent Literature

Non Patent Document 1: Proc. SPIE Vol. 7969, 796915 (2011)

SUMMARY OF INVENTION

Technical Problem

The present invention has been made in view of the above circumstances, and an object thereof is to provide a metal-containing resist material having high sensitivity and high resolution particularly in EUV and electron beam lithography; and a patterning process using this material.

Solution to Problem

To achieve the object, the present invention provides a resist material comprising:
(i) a metal compound shown by the following general formula (M-1) and (ii) an organic solvent,

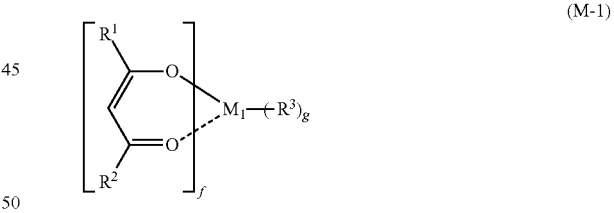

(M-1)

wherein $M_1$ represents an element selected from titanium, zirconium, hafnium, and tin; $R^1$ and $R^2$ each independently represents a linear or branched alkyl group or alkoxy group having 1 to 6 carbon atoms or an aryl group having 6 to 20 carbon atoms, and one or more hydrogen atoms are optionally substituted with a halogen atom; $R^3$ represents a halogen atom or a linear or branched alkyl group or alkoxy group having 1 to 6 carbon atoms; and "f" represents 1 to 4 and "g" represents 0 to 3, where f+g=4.

A metal-containing resist material having high sensitivity and high resolution particularly in EUV and electron beam lithography can be achieved by such a resist material.

Furthermore, the resist material preferably further comprises: (iii) a compound (iii-1), which is a (partial) condensate or a (partial) hydrolysis-condensate of a metal compound shown by the following general formula (A-1), or a compound (iii-2), which is a reaction product of the compound (iii-1) and a dihydric or trihydric alcohol shown by the following general formula (A-2),

$$M_2(OR^{1A})_4 \quad (A\text{-}1)$$

wherein $M_2$ represents an element selected from titanium, zirconium, and hafnium; and $R^{1A}$ represents a linear or branched alkyl group having 1 to 12 carbon atoms; and

$$R^{2A}(OH)_m \quad (A\text{-}2)$$

wherein "m" represents 2 or 3; when "m" represents 2, $R^{2A}$ represents a divalent group selected from a substituted or unsubstituted, linear, branched, or cyclic alkylene group, alkenylene group, alkynylene group, or aralkylene group having 2 to 20 carbon atoms optionally including an ester bond or ether bond; when "m" represents 3, $R^{2A}$ represents a trivalent group, which is the divalent group having one hydrogen atom removed.

Resolution can be further improved when such a component (iii) is contained.

Furthermore, the resist material preferably further comprises (iv) a photo-acid generator.

In this event, the component (iv) is preferably a compound that generates a carboxylic acid shown by the following general formula (B-3) or (B-4),

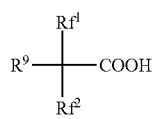

(B-3)

wherein $R^9$ represents a linear, branched, or cyclic alkyl group, alkenyl group, or oxoalkyl group having 5 to 20 carbon atoms optionally including an ester bond or ether bond, or an aryl group, aralkyl group, or aryloxoalkyl group having 6 to 20 carbon atoms, and one or more hydrogen atoms are optionally substituted with a halogen atom, hydroxy group, carboxy group, or amino group; furthermore, $R^9$ optionally represents a hydroxy group; $Rf^1$ and $Rf^2$ each independently represents a fluorine atom or trifluoromethyl group; and

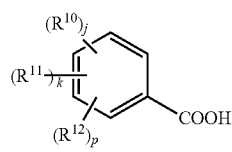

(B-4)

wherein $R^{10}$ to $R^{12}$ each independently represents a halogen atom, hydroxy group, carboxy group, substituted or unsubstituted, linear, branched, or cyclic alkyl group, alkenyl group, alkoxy group, alkoxycarbonyl group, or alkylcarbonyloxy group having 1 to 10 carbon atoms; and j, k, and p each independently represents 0 to 5, where j+k+p≤5.

Photosensitivity to high-energy beam becomes higher when such a photo-acid generator is contained.

Furthermore, the resist material preferably further comprises (v) a basic compound.

In this event, the component (v) is preferably a nitrogen-containing compound.

When such a basic compound is contained, sensitivity can be adjusted, and in addition, generation of residue in a dissolved portion of the resist can be suppressed.

In addition, the present invention provides a patterning process comprising the steps of: coating a substrate with the resist material described above (s1), performing a heat treatment (s2), exposing with a high-energy beam (s3), and developing using a developer (s4).

A high-resolution pattern can be formed by such a patterning process.

Furthermore, the developer preferably contains 60 mass % or more, based on a total amount of the developer, of one or more types of organic solvents selected from 2-octanone, 2-nonanone, 2-heptanone, 3-heptanone, 4-heptanone, 2-hexanone, 3-hexanone, diisobutyl ketone, 2-methyl cyclohexanone, 3-methyl cyclohexanone, 4-methyl cyclohexanone, acetophenone, 2'-methylacetophenone, 4'-methylacetophenone, butyl acetate, isobutyl acetate, amyl acetate, isoamyl acetate, phenyl acetate, methyl valerate, methyl 2-hydroxyisobutyrate, ethyl 2-hydroxyisobutyrate, methyl benzoate, ethyl benzoate, benzyl acetate, methyl phenylacetate, and methyl 3-phenylpropionate.

Such a developer can be used suitably in the present invention.

Furthermore, a vacuum ultraviolet ray with a wavelength of 3 to 15 nm or an acceleration voltage electron beam with an acceleration voltage of 1 to 250 kV is preferably used as a light source in the step (s3).

Exposure under such conditions is favorable in view of sensitivity and resolution.

Advantageous Effects of Invention

The resist material according to the present invention is suitable for negative patterning which uses organic solvent development, and shows excellent high-sensitivity resolution in EUV and EB lithography. In addition, generation of residue after development in unexposed portions can be suppressed. The inventive resist material is particularly effective for miniaturization of narrow trench patterns.

DESCRIPTION OF EMBODIMENTS

As described above, development of a metal-containing resist material having high sensitivity and high resolution particularly in EUV and electron beam lithography has been desired.

To achieve the above object, the present inventors have earnestly studied and found that by using a developer containing an organic solvent in a patterning process using high-energy beam exposure, a resist material containing both a metal compound having a particular β-diketo ligand and an organic solvent shows high resolution and that the minimum processing size of narrow trench patterns can be miniaturized, and arrived at the present invention.

That is, the present invention is a resist material comprising: (i) a metal compound shown by the above general formula (M-1) and (ii) an organic solvent.

Hereinafter, the present invention will be described in detail, but the present invention is not limited thereto.

<Component (i)>

The inventive resist material contains, as the component (i), a metal compound shown by the following general formula (M-1):

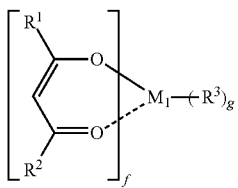 (M-1)

where $M_1$ represents an element selected from titanium, zirconium, hafnium, and tin; $R^1$ and $R^2$ each independently represents a linear or branched alkyl group or alkoxy group having 1 to 6 carbon atoms or an aryl group having 6 to 20 carbon atoms, and one or more hydrogen atoms are optionally substituted with a halogen atom; $R^3$ represents a halogen atom or a linear or branched alkyl group or alkoxy group having 1 to 6 carbon atoms; and "f" represents 1 to 4 and "g" represents 0 to 3, where f+g=4.

Specific examples of the metal compound of the component (i) include the following.

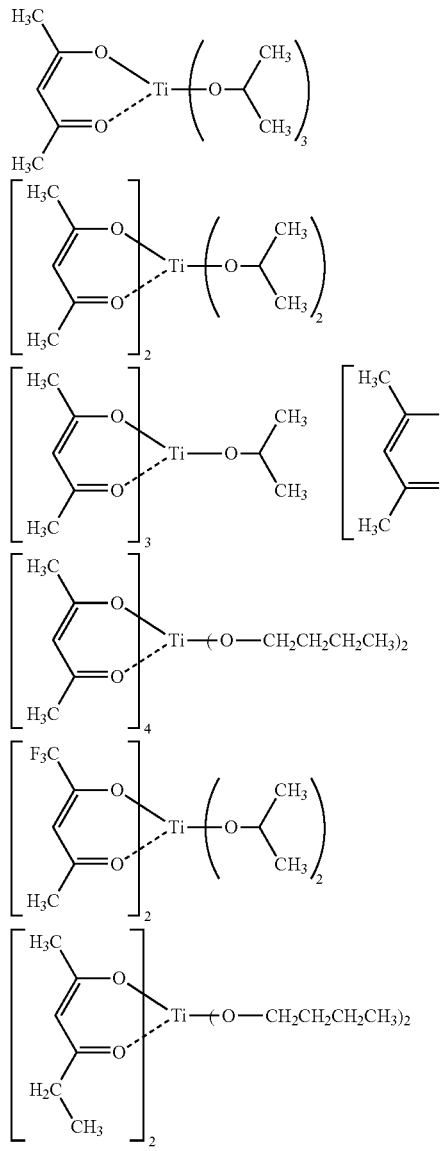
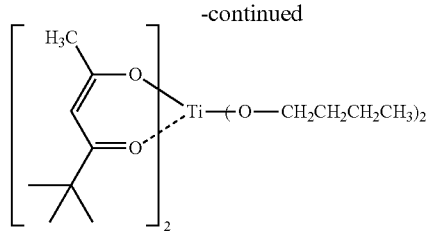
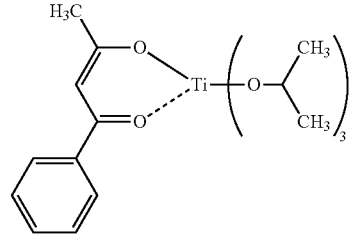
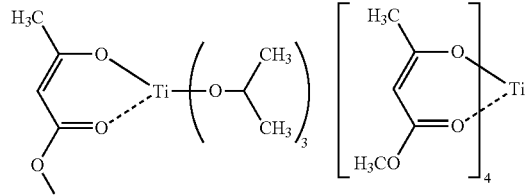
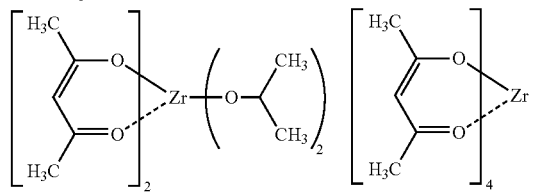
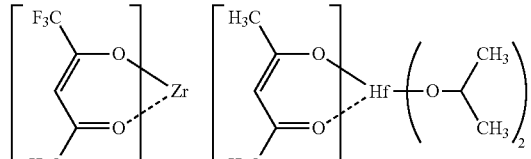
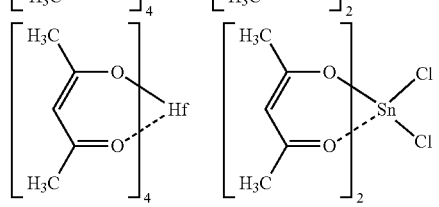

When the metal compound of the component (i) is contained, resolution is improved and fine trench patterns can be formed. It can be considered that the bond between the β-diketo ligand and the metal atom that the component (i) has is dissociated by the irradiation with the high-energy beam, and subsequently, a condensation reaction takes place so that increase in molecular weight is promoted and dissolution contrast is improved.

<Component (ii)>

The resist of the present invention contains an organic solvent as the component (ii), and specific examples of the organic solvent include ketones such as cyclohexanone, methyl-2-n-amyl ketone, and 2-heptanone; alcohols such as 3-methoxybutanol, 3-methyl-3-methoxybutanol, 1-methoxy-2-propanol, 1-ethoxy-2-propanol, and 4-methyl-2-pentanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; lactones such as γ-butyrolactone; and mixed solvents thereof.

Note that the amount of the organic solvent to be blended is preferably 100 to 10,000 parts by mass, particularly preferably 300 to 8,000 parts by mass relative to 100 parts by mass of the total amount of the component (i) and the component (iii) from viewpoints of film formation and solvent solubility.

<Component (iii)>

The inventive resist material preferably contains, as the component (iii), any of a compound (iii-1) obtained by using a metal compound shown by the following general formula (A-1) as a starting material and (partially) condensing or (partially) hydrolysis-condensing this compound, or a compound (iii-2) obtained by further reaction of a dihydric or trihydric alcohol shown by the following general formula (A-2) on this compound (iii-1), $$M_2(OR^{1A})_4 \quad (A-1)$$

where $M_2$ represents an element selected from titanium, zirconium, and hafnium; and $R^{1A}$ represents a linear or branched alkyl group having 1 to 12 carbon atoms; and $$R^{2A}(OH)_m \quad (A-2)$$

where "m" represents 2 or 3; when "m" represents 2, R2A represents a divalent group selected from a substituted or unsubstituted, linear, branched, or cyclic alkylene group, alkenylene group, alkynylene group, or aralkylene group having 2 to 20 carbon atoms optionally including an ester bond or ether bond; when "m" represents 3, $R^{2A}$ represents a trivalent group, which is the divalent group having one hydrogen atom removed.

Specific examples of the monovalent organic group $R^{1A}$ in the general formula (A-1) include a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, a neopentyl group, an n-hexyl group, an n-heptyl group, an n-octyl group, an n-nonyl group, an n-decyl group, and the like.

Specific examples of the dihydric or trihydric alcohol shown by the general formula (A-2) include the following.

-continued

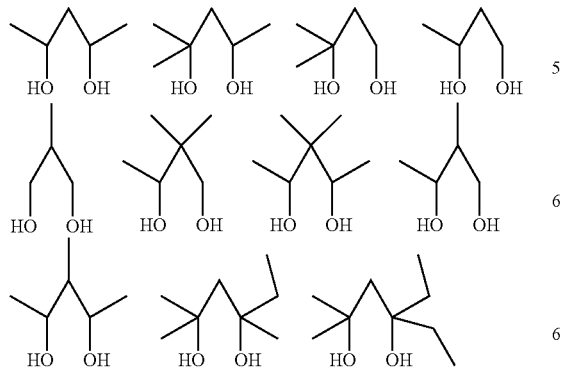

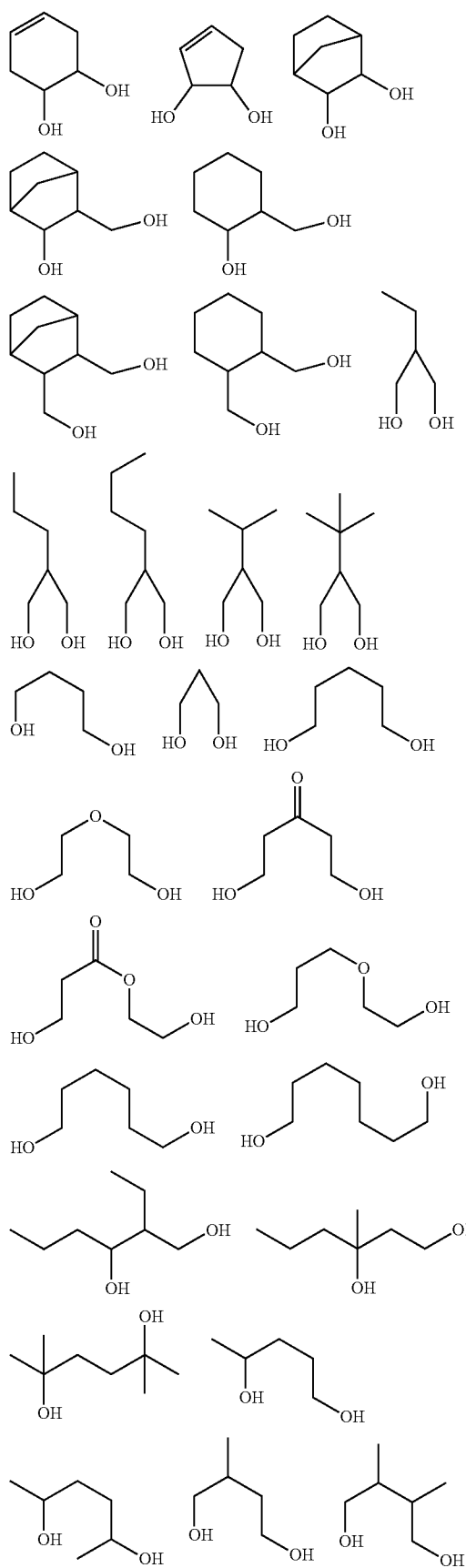
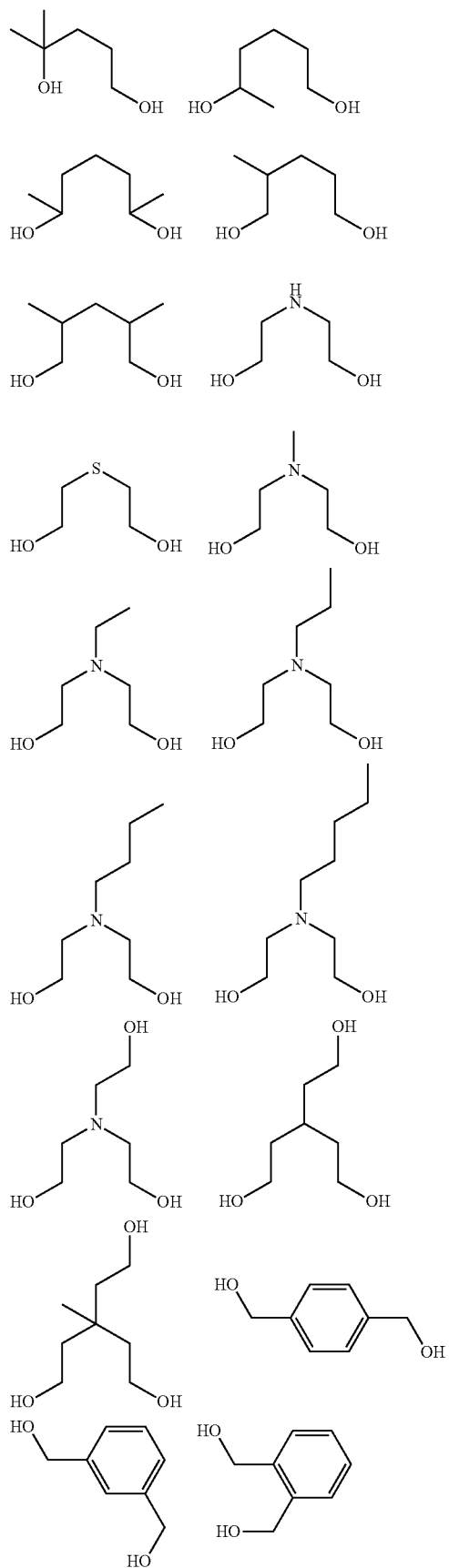

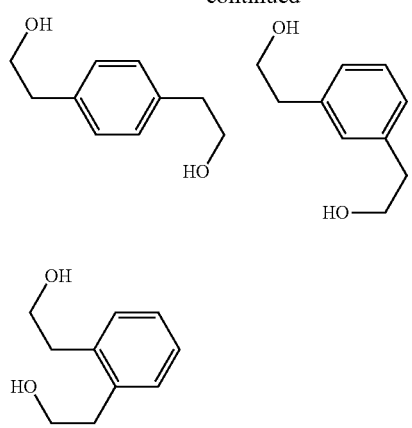

By the action of a dihydric or trihydric alcohol $R^{2A}(OH)_m$ shown by (A-2) on an alkoxy group —$OR^{1A}$ that the compound (iii-1) obtained by a (partial) condensation or a (partial) hydrolysis-condensation of a metal compound shown by the general formula (A-1) has, an alkoxy exchange reaction takes place, and a compound (iii-2) that has an alkoxy group —$OR^{2A}$ can be produced.

As a method for (partially) condensing or (partially) hydrolysis-condensing a metal compound of the formula (A-1), a known method, for example, a hydrolysis-condensation reaction method of adding water to a metal alkoxide can be applied. In addition, as a method for the reaction with an alcohol of the formula (A-2), a known method can also be applied, for example, a method of adding an alcohol of the formula (A-2), and then heating or reducing pressure to discharge an alcohol $R^{1A}OH$ outside the system.

The obtained compound (iii-1) or (iii-2) preferably has a weight average molecular weight of 500 to 100,000, in particular 700 to 50,000 in terms of polystyrene determined by gel permeation chromatography (GPC).

In addition, besides a diol or triol compound shown by the formula (A-2), further action of an alcohol having 5 or more carbon atoms is also possible. Specific examples of alcohol having 5 or more carbon atoms include the following. In this case, the alcohol shown by the formula (A-2) and the alcohol having 5 or more carbon atoms may be added at the same time, or action of either one may be performed first, and then action of the other may be performed.

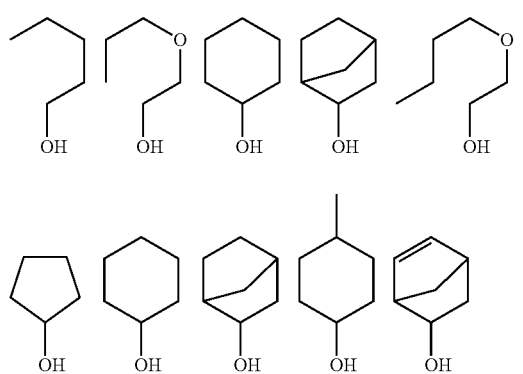

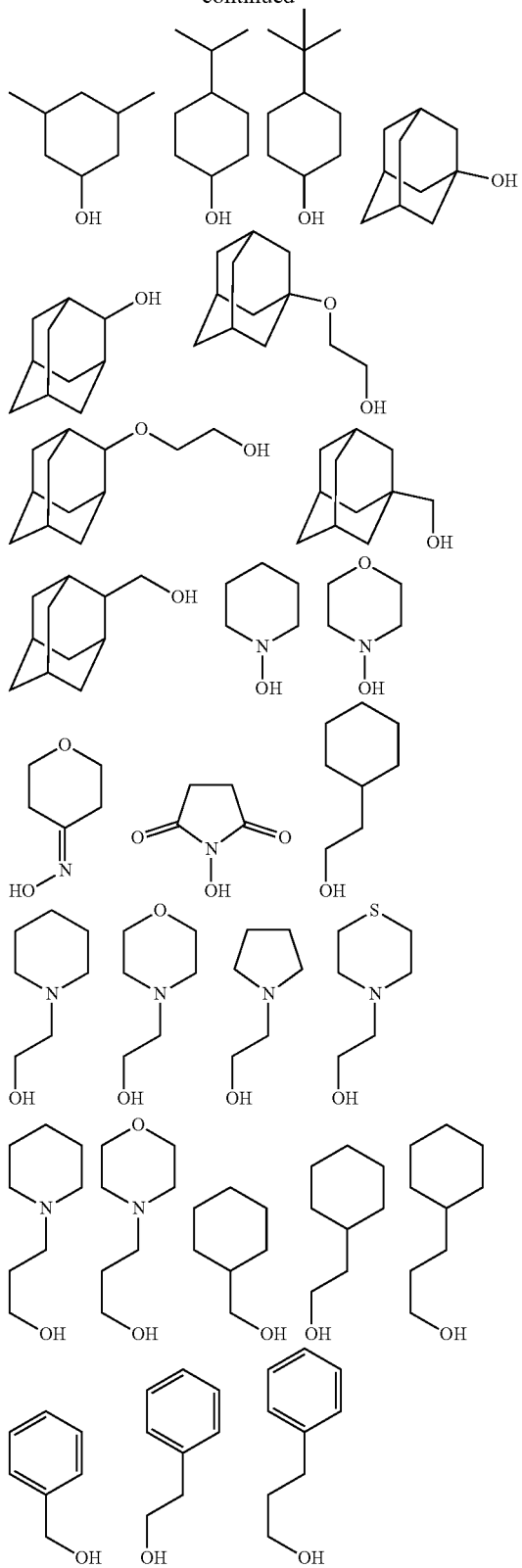

When the metal compound of the component (iii) is contained, resolution can be further improved. It can be considered that the bond between the β-diketo ligand and the metal atom that the metal compound of the component (i)

has is dissociated by the irradiation with the high-energy beam, and then reaction with the metal compound of the component (iii) takes place, so that increase in molecular weight progresses more efficiently and dissolution contrast is improved.

The component (i) and the component (iii) are preferably blended so that the proportion of the component (i) to the total amount of the component (i) and the component (iii) is 5 to 80 mass %, particularly preferably, 10 to 60 mass %.

<Component (iv)>

The inventive resist material preferably further contains a photo-acid generator as a component (iv). Higher sensitivity can be achieved by adding a photo-acid generator. It is considered that acid generated from the photo-acid generator coordinates to the metal in portions irradiated with a high-energy beam, and solubility to the organic solvent developer is lowered, or the acid promotes the (partial) hydrolysis-condensation, leading to higher sensitivity.

The photo-acid generator may be any compound as long as the compound generates acid by irradiation with a high-energy beam. Examples include a sulfonium salt, an iodonium salt, sulfonyl diazomethane, N-sulfonyl oximide, and oxime-O-sulfonate photo-acid generator, and more specific examples include the compounds described in paragraphs [0122] to [0142] in JP 2008-111103 A.

Furthermore, favorable examples of the sulfonium salt and the iodonium salt include a compound that has a sulfonium cation shown by the following general formula (B-1) or an iodonium cation shown by the following general formula (B-2) and generates a sulfonic acid or a carboxylic acid by the action of light,

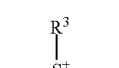  (B-1)

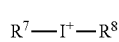  (B-2)

where $R^3$, $R^4$, and $R^5$ independently represent a substituted or unsubstituted, linear, branched, or cyclic alkyl group, alkenyl group, or oxoalkyl group having 1 to 10 carbon atoms, or a substituted or unsubstituted aryl group, aralkyl group, or aryloxoalkyl group having 6 to 18 carbon atoms; furthermore, any two or more of $R^3$, $R^4$, and $R^5$ are optionally bonded with each other to form a ring with a sulfur atom in the formula; $R^7$ and $R^8$ independently represent a substituted or unsubstituted aryl group having 6 to 18 carbon atoms.

An onium salt compound that has a cation shown by the general formula (B-1) or (B-2) has high thermal stability and high photosensitivity to high-energy beam. Specific examples of such a cation structure include the following, but the structure is not limited thereto.

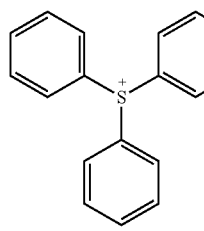

-continued

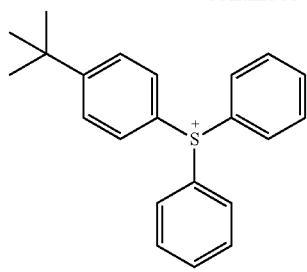

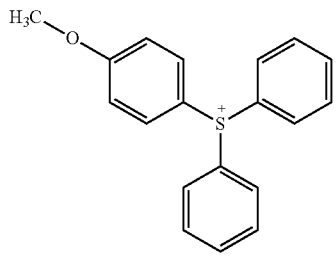

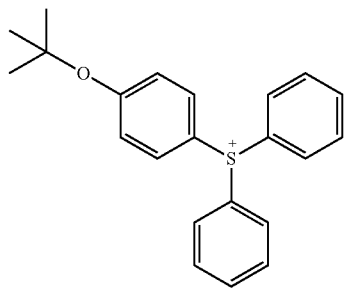

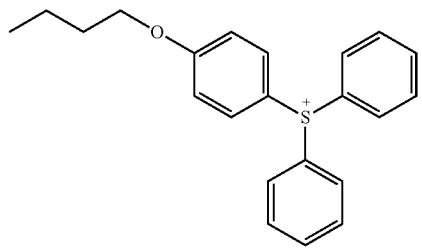

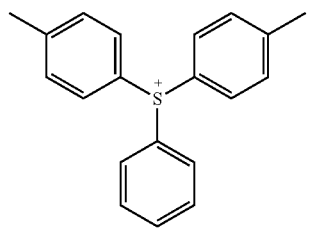

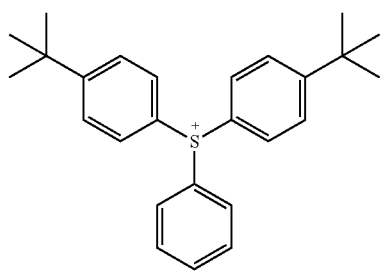

-continued
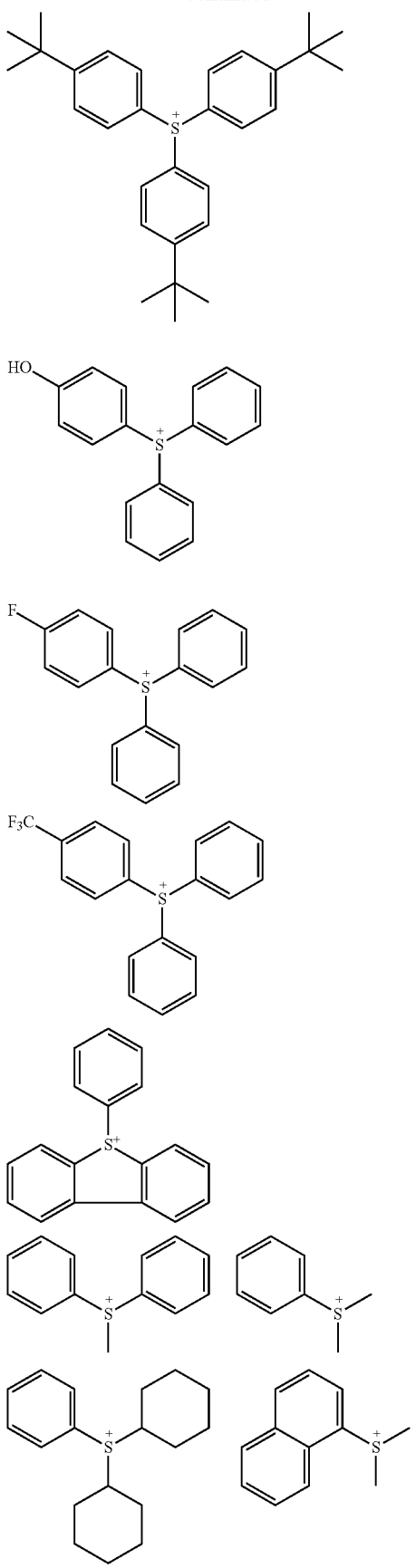
-continued
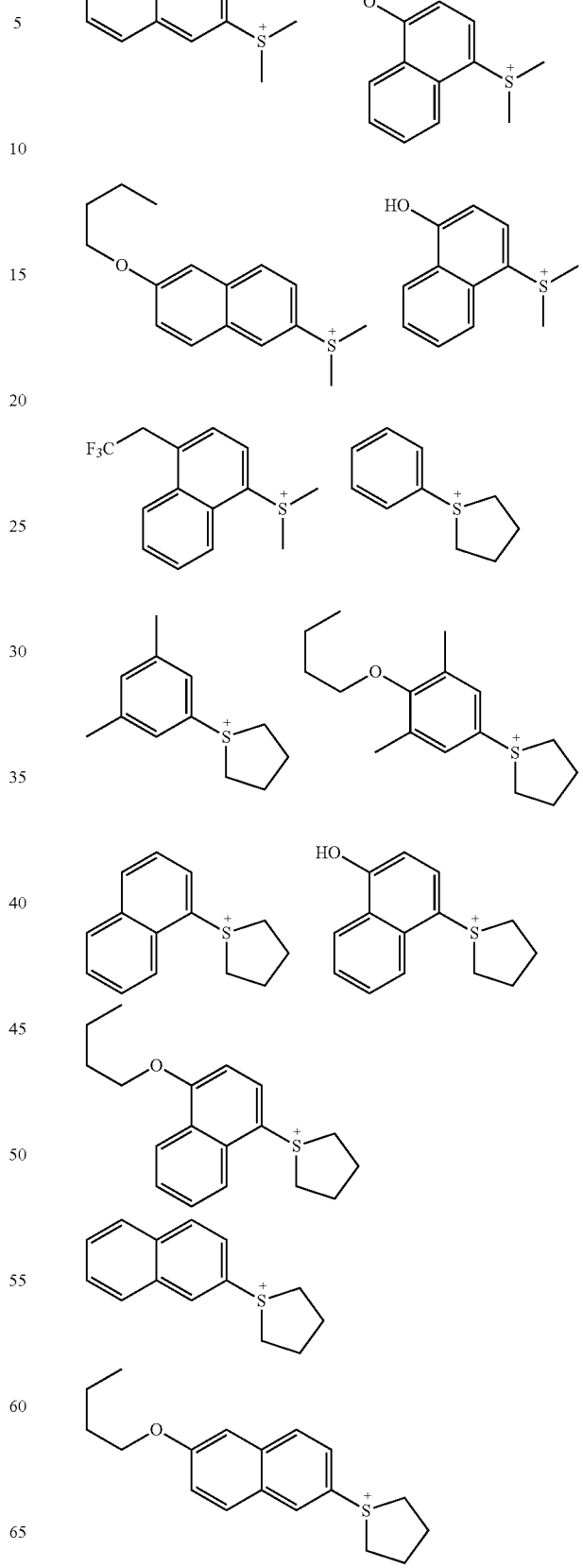

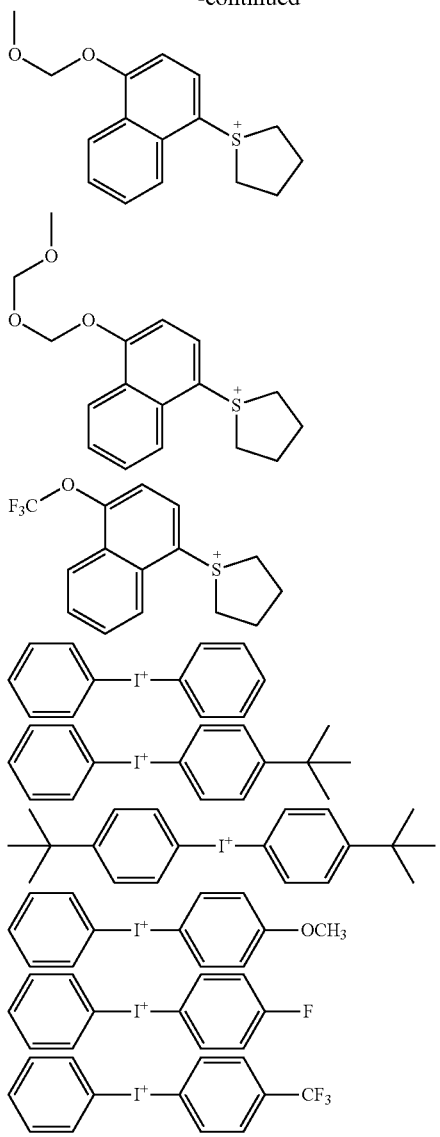

Furthermore, a particularly favorable type of acid to be generated from the photo-acid generator is a carboxylic acid shown by the following general formula (B-3) or (B-4),

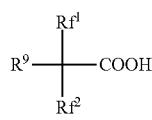 (B-3)

where R⁹ represents a linear, branched, or cyclic alkyl group, alkenyl group, or oxoalkyl group having 5 to 20 carbon atoms optionally including an ester bond or ether bond, or an aryl group, aralkyl group, or aryloxoalkyl group having 6 to 20 carbon atoms, and one or more hydrogen atoms are optionally substituted with a halogen atom, hydroxy group, carboxy group, or amino group; furthermore, R⁹ optionally represents a hydroxy group; Rf¹ and Rf² each independently represents a fluorine atom or trifluoromethyl group; and

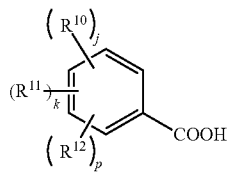 (B-4)

where $R^{10}$ to $R^{12}$ each independently represents a halogen atom, hydroxy group, carboxy group, substituted or unsubstituted, linear, branched, or cyclic alkyl group, alkenyl group, alkoxy group, alkoxycarbonyl group, or alkylcarbonyloxy group having 1 to 10 carbon atoms; and j, k, and p each independently represents 0 to 5, where j+k+p≤5.

Specific examples of the carboxylic acid shown by the general formula (B-3) include but are not limited to the following.

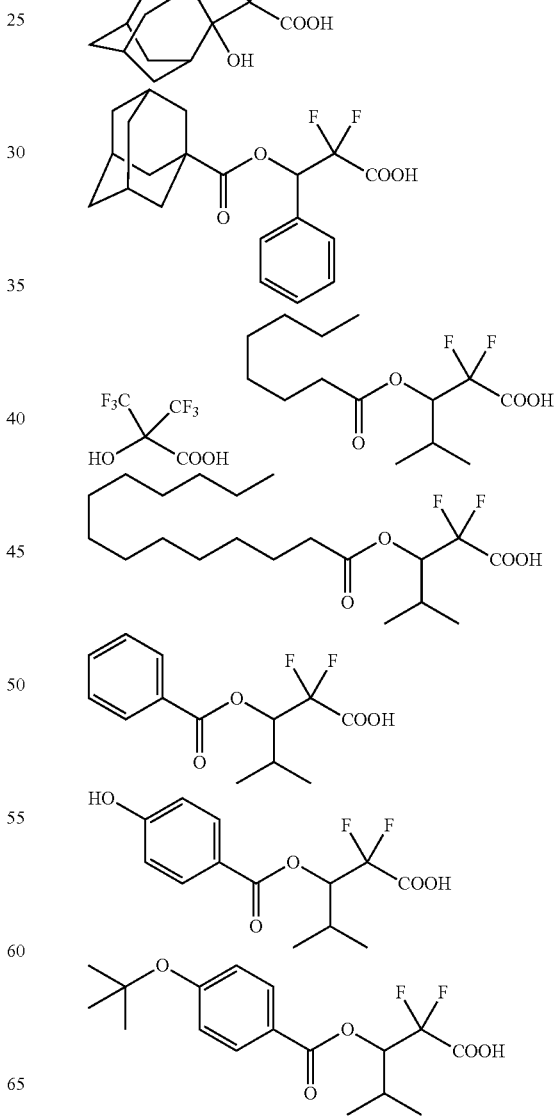

-continued

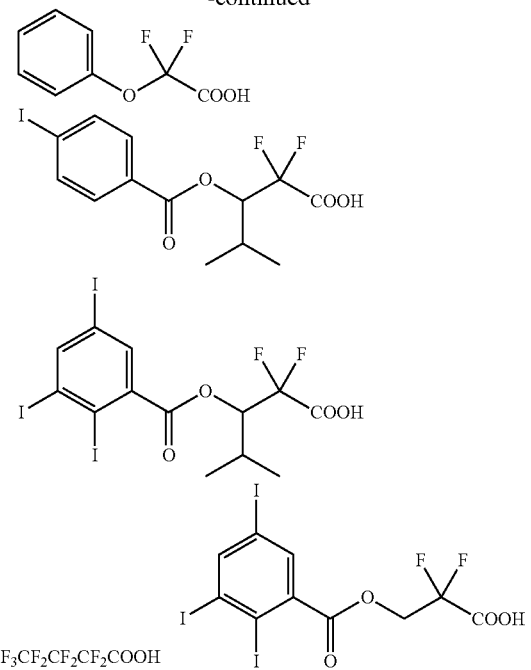

CF₃CF₂CF₂CF₂COOH

Next, specific examples of the carboxylic acid shown by the general formula (B-4) include the following but are not limited to the following.

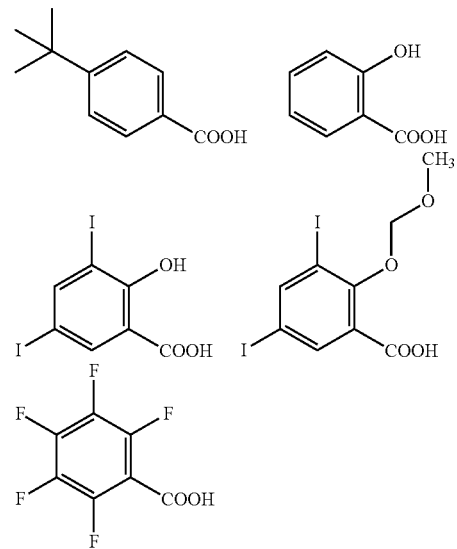

Furthermore, the blended amount of the photo-acid generator of the component (iv) contained in a resist composition of the present invention is preferably 0.5 to 30 parts by mass, particularly preferably 1 to 15 parts by mass relative to 100 parts by mass of the total amount of the component (i) and the component (iii).

<Component (v)>

The resist composition of the present invention preferably contains a basic compound as the component (v). The basic compound indicates a compound that has basicity for neutralizing the acid generated by the photo-acid generator, and is effective for preventing the resist film from becoming insoluble in unexposed regions or low-exposure regions and suppressing the generation of residue while making it possible to adjust sensitivity.

Preferable basic compounds are nitrogen-containing compounds (nitrogen-containing organic compounds), and specific examples include a primary, secondary, and tertiary aliphatic amine, a hybrid amine, an aromatic amine, a heterocyclic amine, a nitrogen-containing compound having a carboxy group, a nitrogen-containing compound having a sulfonyl group, a nitrogen-containing compound having a hydroxy group, a nitrogen-containing compound having a hydroxyphenyl group, an alcoholic nitrogen-containing compound, an amide, an imide, a carbamate, and the like.

More specifically, examples of the primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, tetraethylenepentamine, and the like; examples of the secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, N,N-dimethyltetraethylenepentamine, and the like; examples of the tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, N,N,N',N'-tetramethyltetraethylenepentamine, and the like.

In addition, examples of the hybrid amines include dimethylethylamine, methylethylpropylamine, benzylamine, phenethylamine, benzyldimethylamine, and the like. Specific examples of the aromatic amines and heterocyclic amines include aniline derivatives (for example, aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, N,N-dimethyltoluidine, and the like), diphenyl(p-tolyl)amine, methyldiphenylamine, triphenylamine, phenylenediamine, naphthylamine, diaminonaphthalene, pyrrole derivatives (for example, pyrrole, 2H-pyrrole, 1-methylpyrrole, 2,4-dimethylpyrrole, 2,5-dimethylpyrrole, N-methylpyrrole, and the like), oxazole derivatives (for example, oxazole, isoxazole, and the like), thiazole derivatives (for example, thiazole, isothiazole, and the like), imidazole derivatives (for example, imidazole, 4-methylimidazole, 4-methyl-2-phenylimidazole, and the like), pyrazole derivatives, furazan derivatives, pyrroline derivatives (for example, pyrroline, 2-methyl-1-pyrroline, and the like), pyrrolidine derivatives (for example, pyrrolidine, N-methylpyrrolidine, pyrrolidinone, N-methylpyrrolidone, and the like), imidazoline derivatives, imidazolidine derivatives, pyridine derivatives (for example, pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 4-pyrrolidinopyridine, 2-(1-ethylpropyl) pyridine, aminopyridine, dimethylaminopyridine, and the like), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (for example, quinoline, 3-quinolinecarbonitrile, and the like), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, uridine derivatives, and the like.

Furthermore, examples of the nitrogen-containing compounds having a carboxy group include aminobenzoic acid, indolecarboxylic acid, amino acid derivatives (for example, nicotinic acid, alanine, arginine, aspartic acid, glutamic acid, glycine, histidine, isoleucine, glycylleucine, leucine, methionine, phenylalanine, threonine, lysine, 3-aminopyrazine-2-carboxylic acid, methoxyalanine, and the like), and the like; examples of the nitrogen-containing compounds having a sulfonyl group include 3-pyridine sulfonic acid, pyridinium p-toluenesulfonate, and the like; examples of the nitrogen-containing compounds having a hydroxy group, the nitrogen-containing compounds having a hydroxyphenyl group, and the alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl) pyridine, 1-(2-hydroxyethyl)piperazine, 1-[2-(2-hydroxyethoxy)ethyl]piperazine, piperidineethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidineethanol, 1-aziridineethanol, N-(2-hydroxyethyl)phthalimide, N-(2-hydroxyethyl) isonicotinamide, and the like. Examples of the amides include formamide, N-methylformamide, N,N-dimethylformamide, acetamide, N-methylacetamide, N,N-dimethylacetamide, propionamide, benzamide, 1-cyclohexylpyrrolidone and the like. Examples of the imides include phthalimide, succinimide, maleimide, and the like. Examples of the carbamates include N-t-butoxycarbonyl-N,N-dicyclohexylamine, N-t-butoxycarbonylbenzimidazole, oxazolidinone and the like.

Furthermore, examples include nitrogen-containing organic compounds shown by the following general formula (C)-1:

$$N(X)_n(Y)_{3-n} \quad (C)\text{-}1$$

where "n" represents 1, 2, or 3. The side chains X may be the same or different from each other, and can be shown by the following general formulae (X1) to (X3). The side chains Y represent the same or different types out of a hydrogen atom or a linear, branched or cyclic alkyl group having 1 to 20 carbon atoms, and may contain an ether group or a hydroxy group. In addition, the Xs may bond to each other to form a ring.

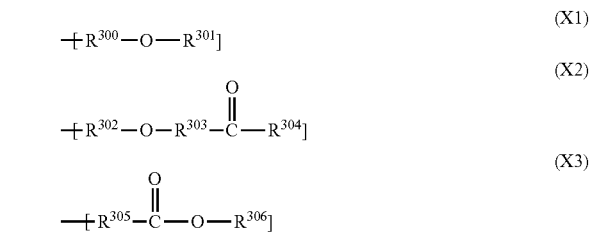

In the above general formulae (X1) to (X3), $R^{300}$, $R^{302}$, and $R^{305}$ represent a linear or branched alkylene group having 1 to 4 carbon atoms; and $R^{301}$ and $R^{304}$ represent a hydrogen atom or a linear, branched or cyclic alkyl group having 1 to 20 carbon atoms, and may contain one or more hydroxy groups, ether groups, ester groups, or lactone rings. $R^{303}$ represents a single bond, or a linear or branched alkylene group having 1 to 4 carbon atoms, $R^{306}$ represents a linear, branched or cyclic alkyl group having 1 to 20 carbon atoms, and may contain one or more hydroxy groups, ether groups, ester groups, or lactone rings.

Specific examples of the compound shown by the general formula (C)-1 include tris(2-methoxymethoxyethyl) amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5,1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)2-(acetoxyacetoxy)ethylamine, tris(2-methoxycarbonyloxyethyl)amine, tris(2-tert-butoxycarbonyloxyethyl)amine, tris[2-(2-oxopropoxy)ethyl] amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)2-(methoxycarbonyl)ethylamine, N,N-bis(2-acetoxyethyl)2-(methoxycarbonyl)ethylamine, N,N-bis(2-hydroxyethyl)2-(ethoxycarbonyl)ethylamine, N,N-bis(2-acetoxyethyl)2-(ethoxycarbonyl)ethylamine, N,N-bis(2-hydroxyethyl)2-(2-methoxyethoxycarbonyl)ethylamine, N,N-bis(2-acetoxyethyl)2-(2-methoxyethoxycarbonyl)ethylamine, N,N-bis(2-hydroxyethyl)2-(2-hydroxyethoxycarbonyl)ethylamine, N,N-bis(2-acetoxyethyl)2-(2-acetoxyethoxycarbonyl)ethylamine, N,N-bis(2-hydroxyethyl)2-[(methoxycarbonyl)methoxycarbonyl]ethylamine, N,N-bis(2-acetoxyethyl)2-[(methoxycarbonyl)methoxycarbonyl]ethylamine, N,N-bis(2-hydroxyethyl)2-(2-oxopropoxycarbonyl)ethylamine, N,N-bis(2-acetoxyethyl)2-(2-oxopropoxycarbonyl)ethylamine, N,N-bis(2-hydroxyethyl) 2-(tetrahydrofurfuryloxycarbonyl)ethylamine, N,N-bis(2-acetoxyethyl)2-(tetrahydrofurfuryloxycarbonyl)ethylamine, N,N-bis(2-hydroxyethyl)2-[(2-oxotetrahydrofuran-3-yl) oxycarbonyl]ethylamine, N,N-bis(2-acetoxyethyl)2-[(2-oxotetrahydrofuran-3-yl)oxycarbonyl]ethylamine, N,N-bis (2-hydroxyethyl)2-(4-hydroxybutoxycarbonyl)ethylamine, N,N-bis(2-formyloxyethyl)2-(4-formyloxybutoxycarbonyl) ethylamine, N,N-bis(2-formyloxyethyl)2-(2-formyloxyethoxycarbonyl)ethylamine, N,N-bis(2-methoxyethyl)2-

(methoxycarbonyl)ethylamine, N-(2-hydroxyethyl)bis[2-(methoxycarbonyl)ethyl]amine, N-(2-acetoxyethyl)bis[2-(methoxycarbonyl)ethyl]amine, N-(2-hydroxyethyl)bis[2-(ethoxycarbonyl)ethyl]amine, N-(2-acetoxyethyl)bis[2-(ethoxycarbonyl)ethyl]amine, N-(3-hydroxy-1-propyl)bis[2-(methoxycarbonyl)ethyl]amine, N-(3-acetoxy-1-propyl)bis[2-(methoxycarbonyl)ethyl]amine, N-(2-methoxyethyl)bis[2-(methoxycarbonyl)ethyl]amine, N-butylbis[2-(methoxycarbonyl)ethyl]amine, N-butylbis[2-(2-methoxyethoxycarbonyl)ethyl]amine, N-methylbis(2-acetoxyethyl)amine, N-ethylbis(2-acetoxyethyl)amine, N-methylbis(2-pivaloyloxyethyl)amine, N-ethylbis[2-(methoxycarbonyloxy)ethyl]amine, N-ethylbis[2-(tert-butoxycarbonyloxy)ethyl]amine, tris(methoxycarbonylmethyl)amine, tris(ethoxycarbonylmethyl)amine, N-butylbis(methoxycarbonylmethyl)amine, N-hexylbis(methoxycarbonylmethyl)amine, and β-(diethylamino)-5-valerolactone.

Furthermore, examples include a nitrogen-containing organic compound having a cyclic structure shown by the following general formula (C)-2:

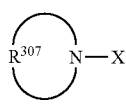

(C)-2 where X is as described above, $R^{307}$ represents a linear or branched alkylene group having 2 to 20 carbon atoms, optionally containing one or more of a carbonyl group, an ether group, an ester group, or a sulfide.

Specific examples of the general formula (C)-2 include 1-[2-(methoxymethoxy)ethyl]pyrrolidine, 1-[2-(methoxymethoxy)ethyl]piperidine, 4-[2-(methoxymethoxy)ethyl]morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino)propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl)propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-5-valerolactone, methyl 1-pyrrolidinylacetate, methyl piperidinoacetate, methyl morpholinoacetate, methyl thiomorpholinoacetate, ethyl 1-pyrrolidinylacetate, 2-methoxyethyl morpholinoacetate, 2-morpholinoethyl 2-methoxyacetate, 2-morpholinoethyl 2-(2-methoxyethoxy)acetate, 2-morpholinoethyl 2-[2-(2-methoxyethoxy)ethoxy]acetate, 2-morpholinoethyl hexanoate, 2-morpholinoethyl octanoate, 2-morpholinoethyl decanoate, 2-morpholinoethyl laurate, 2-morpholinoethyl myristate, 2-morpholinoethyl palmitate, 2-morpholinoethyl stearate, and the like.

Furthermore, examples include nitrogen-containing organic compounds containing a cyano group shown by the following general formulae (C)-3 to (C)-6:

(C)-3

(C)-4

(C)-5

(C)-6 where X, $R^{307}$, and "n" are as described above, and $R^{308}$ and $R^{309}$ represent the same or different types of linear or branched alkylene group having 1 to 4 carbon atoms.

Specific examples of the nitrogen-containing organic compound containing a cyano group shown by the general formulae (C)-3 to (C)-6 include 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiononitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl)aminoacetonitrile, N,N-bis(2-acetoxyethyl)aminoacetonitrile, N,N-bis(2-formyloxyethyl)aminoacetonitrile, N,N-bis(2-methoxyethyl)aminoacetonitrile, N,N-bis[2-(methoxymethoxy)ethyl]aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl]aminoacetonitrile, N-(cyanomethyl)-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl)aminoacetonitrile, N,N-bis(cyanomethyl)aminoacetonitrile, 1-pyrrolidinepropiononitrile, 1-piperidine-propiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)ethyl]-3-aminopropionate, (2-cyanoethyl) 3-diethylaminopropionate, (2-cyanoethyl) N,N-bis(2-hydroxyethyl)-3-aminopropionate, (2-cyanoethyl) N,N-bis(2-acetoxyethyl)-3-aminopropionate, (2-cyanoethyl) N,N-bis(2-formyloxyethyl)-3-aminopropionate, (2-cyanoethyl) N,N-bis(2-methoxyethyl)-3-aminopropionate, (2-cyanoethyl) N,N-bis[2-(methoxymethoxy)ethyl]-3-aminopropionate, cyanomethyl 1-pyrrolidinepropionate, cyanomethyl 1-piperidinepropionate, cyanomethyl 4-morpholinepropionate, (2-cyanoethyl) 1-pyrrolidinepropionate, (2-cyanoethyl) 1-piperidinepropionate, (2-cyanoethyl) 4-morpholinepropionate, and the like.

Furthermore, examples include nitrogen-containing organic compounds that have an imidazole skeleton shown by the following general formula (C)-7 and a polar functional group:

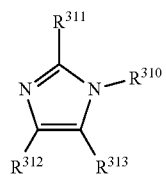

(C)-7 where $R^{310}$ represents an alkyl group that has a linear, branched or cyclic polar functional group having 2 to 20 carbon atoms, and as the polar functional group, one or more of hydroxy groups, carbonyl groups, ester groups, ether groups, sulfide groups, carbonate groups, cyano groups, or acetal groups are contained; and $R^{311}$, R312, and $R^{313}$ represent a hydrogen atom, a linear, branched or cyclic alkyl group having 1 to 10 carbon atoms, aryl group, or aralkyl group.

Furthermore, examples include nitrogen-containing organic compounds that have a benzimidazole skeleton shown by the following general formula (C)-8 and a polar functional group:

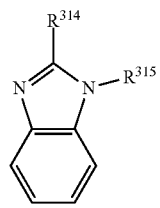

(C)-8 where $R^{314}$ represents a hydrogen atom, a linear, branched or cyclic alkyl group having 1 to 10 carbon atoms, aryl group, or aralkyl group; $R^{315}$ represents a hydrogen atom or an alkyl group that has a linear, branched or cyclic polar functional group having 1 to 20 carbon atoms, and as the polar functional group, one or more ester groups, acetal groups, or cyano groups are contained, and besides this, one or more hydroxy groups, carbonyl groups, ether groups, sulfide groups, or carbonate groups are optionally contained.

Furthermore, examples include nitrogen-containing heterocyclic compounds having a polar functional group shown by the following general formulae (C)-9 and (C)-10:

(C)-9

(C)-10 where A represents a nitrogen atom or $\equiv C-R^{322}$; B represents a nitrogen atom or $\equiv C-R^{323}$; $R^{316}$ represents an alkyl group that has a linear, branched or cyclic polar functional group having 2 to 20 carbon atoms, and as the polar functional group, one or more hydroxy groups, carbonyl groups, ester groups, ether groups, sulfide groups, carbonate groups, cyano groups or acetal groups are contained; $R^{317}$, $R^{318}$, $R^{319}$, and $R^{320}$ represent a hydrogen atom, a linear, branched or cyclic alkyl group having 1 to 10 carbon atoms or aryl group, or $R^{317}$ may bond with $R^{318}$, and $R^{319}$ may bond with $R^{320}$ respectively to form a benzene ring, naphthalene ring or pyridine ring; $R^{321}$ represents a hydrogen atom, a linear, branched or cyclic alkyl group having 1 to 10 carbon atoms or aryl group; $R^{322}$ and $R^{323}$ represent a hydrogen atom, a linear, branched or cyclic alkyl group having 1 to 10 carbon atoms or aryl group; $R^{324}$ and $R^{323}$ may be bonded to form a benzene ring or naphthalene ring.

Furthermore, examples include nitrogen-containing organic compounds that have an aromatic carboxylic acid ester structure shown by the following general formulae (C)-11 to (C)-14:

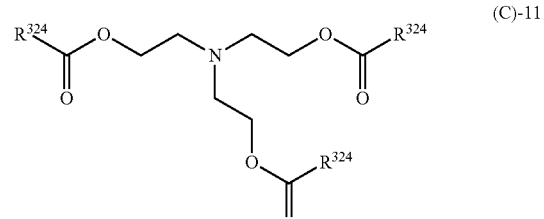

(C)-11

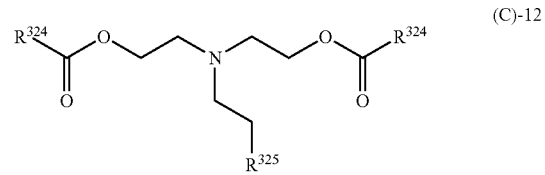

(C)-12

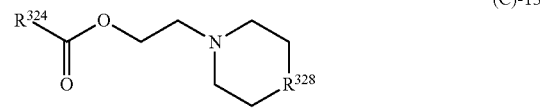

(C)-13

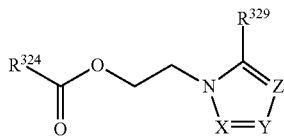

(C)-14 where $R^{324}$ represents an aryl group having 6 to 20 carbon atoms or a hetero-aromatic group having 4 to 20 carbon atoms, and part or all of the hydrogen atoms may be substituted with a halogen atom, a linear, branched or cyclic alkyl group having 1 to 20 carbon atoms, an aryl group having 6 to 20 carbon atoms, an aralkyl group having 7 to 20 carbon atoms, an alkoxy group having 1 to 10 carbon atoms, an acyloxy group having 1 to 10 carbon atoms, or an alkylthio group having 1 to 10 carbon atoms; $R^{325}$ represents $CO_2R^{326}$, $OR^{327}$ or a cyano group; $R^{326}$ represents an alkyl group having 1 to 10 carbon atoms that may have some of its methylene groups substituted with oxygen atoms; $R^{327}$ represents an alkyl group or an acyl group having 1 to 10 carbon atoms that may have some of its methylene groups substituted with oxygen atoms; $R^{328}$ represents a single bond, a methylene group, an ethylene group, a sulfur atom, or a $-O(CH_2CH_2O)_n-$ group; n=0, 1, 2, 3 or 4; $R^{329}$ represents a hydrogen atom, a methyl group, an ethyl group, or a phenyl group; X represents a nitrogen atom or $CR^{330}$; Y represents a nitrogen atom or $CR^{331}$; Z represents a nitrogen atom or $CR^{332}$; $R^{330}$, $R^{331}$, and $R^{332}$ each independently represents a hydrogen atom, a methyl group or a phenyl group, or $R^{330}$ and $R^{331}$ or $R^{331}$ and $R^{332}$ may be bonded to form an aromatic ring having 6 to 20 carbon atoms or a heteroaromatic ring having 2 to 20 carbon atoms.

Furthermore, examples include nitrogen-containing organic compounds having a 7-oxanorbornan-2-carboxylic acid ester structure shown by the following general formula (C)-15:

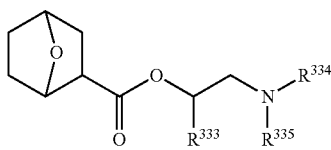

(C)-15 where $R^{333}$ represents hydrogen or a linear, branched or cyclic alkyl group having 1 to 10 carbon atoms; $R^{334}$ and $R^{335}$ each independently represents an alkyl group having 1 to 20 carbon atoms, an aryl group having 6 to 20 carbon atoms, or an aralkyl group having 7 to 20 carbon atoms that optionally contains one or more polar functional groups such as ether, carbonyl, ester, alcohol, sulfide, nitrile, amine, imine, or amide, and some of the hydrogen atoms may be substituted with a halogen atom; $R^{334}$ and $R^{335}$ may be bonded with each other to form a heterocycle or heteroaromatic ring having 2 to 20 carbon atoms.

Note that the amount of nitrogen-containing organic compound to be blended is preferably 0.001 to 5 parts by mass, particularly preferably 0.01 to 3 parts by mass relative to 100 parts by mass of the total amount of the component (i) and the component (iii). When the blended amount is 0.001 parts by mass or more, a sufficient blending effect can be achieved, and when 5 parts by mass or less, there is little risk of sensitivity being degraded.

<Other Components>

The inventive resist material may further contain other components such as a surfactant for the purpose of improving coatability, etc. according to needs. The amount of the other additives such as surfactant to be blended can be appropriately determined in accordance with the purpose of blending.

<Patterning Process>

In addition, the present invention provides a patterning process including the steps of: coating a substrate with the resist material described above (s1), performing a heat treatment (s2), exposing with a high-energy beam (s3), and developing using a developer (s4). Furthermore, a step of performing a heat treatment may also be applied after the exposure in addition to the treatment after the coating. A heat treatment after the exposure is effective for achieving higher sensitivity and higher contrast.

In the step (s1), the method for coating the substrate with the resist material is not particularly limited, and a known method may be applied. For example, it is possible to coat a substrate for producing an integrated circuit or a layer to be processed on the substrate (Si, $SiO_2$, SiN, SiON, TiN, WSi, BPSG, SOG, an organic antireflective film, etc.), alternatively, on a substrate for producing a mask circuit or a layer to be processed on the substrate (Cr, CrO, CrON, $MoSi_2$, $SiO_2$, etc.) by an appropriate coating method such as spin coating, roll coating, flow coating, dip coating, spray coating, and doctor coating so as to have a coating film of 0.01 to 2.0 μm.

In the step (s2), the method for performing the heat treatment is not particularly limited, but can be performed by, for example, pre-baking on a hot plate at 60 to 350° C. for 10 seconds to 30 minutes, preferably at 100 to 300° C. for 30 seconds to 20 minutes.

In the step of exposing a resist film with a high-energy beam (step (s3)), the high-energy beam is preferably a vacuum ultraviolet ray with a wavelength of 3 to 15 nm or an acceleration voltage electron beam with an acceleration voltage of 1 to 250 kV from viewpoints of sensitivity and resolution. It is considered that the bond between metal and a β-diketo ligand and the bond between metal and an alkoxy group are dissociated or a further condensation or (hydrolysis) condensation reaction takes place due to the irradiation with the high-energy beam, changing the solubility to the developer.

In the step of developing (step (s4)), the developer is not particularly limited, and a suitable developer can be selected according to the resist material to be used, but the developer preferably contains one or more types of organic solvents selected from 2-octanone, 2-nonanone, 2-heptanone, 3-heptanone, 4-heptanone, 2-hexanone, 3-hexanone, diisobutyl ketone, 2-methyl cyclohexanone, 3-methyl cyclohexanone, 4-methyl cyclohexanone, acetophenone, 2'-methylacetophenone, 4'-methylacetophenone, butyl acetate, isobutyl acetate, amyl acetate, isoamyl acetate, phenyl acetate, methyl valerate, methyl 2-hydroxyisobutyrate, ethyl 2-hydroxyisobutyrate, methyl benzoate, ethyl benzoate, benzyl acetate, methyl phenylacetate, and methyl 3-phenylpropionate, and the total concentration of these organic solvents is preferably 60 mass % or more relative to the total amount of the developer.

When a developer containing such an organic solvent is used, unexposed portions are dissolved and exposed portions remain as a pattern so that a negative pattern can be formed.

EXAMPLE

Hereinafter, the present invention will be specifically described with reference to Examples and Comparative Examples, but the present invention is not limited thereto.

Examples 1 to 13 and Comparative Examples 1 to 4

In a solvent obtained by dissolving 100 ppm of a fluorine-based surfactant FC-4430 manufactured by 3M as a surfactant, a metal compound of the component (i) (MC-1 to 8) and a metal compound of the component (iii) (A-1 to 7) were dissolved according to the composition shown in Table 1. This solution was filtered through a 0.2-μm filter to prepare resist materials 1 to 17.

Each of the compositions in the following Table 1 is as follows.

PGMEA: propylene glycol monomethyl ether acetate
MAK: 2-heptanone
Metal compound i: MC-1 to 8 (see the following structural formulae)
Metal compound iii: A-1 to 7 (see the following Synthesis Examples)
Photo-acid generator: PAG-1 and 2 (see the following structural formulae)
Basic compound: Base-1 and 2 (see the following structural formulae)

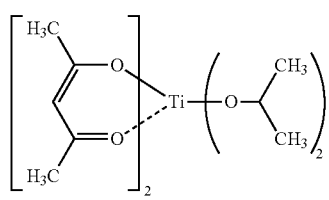
MC-1

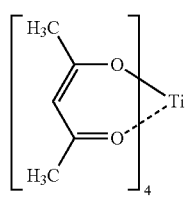
MC-2

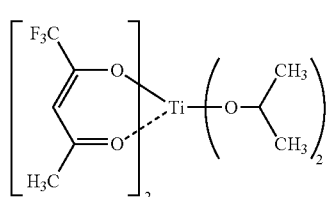
MC-3

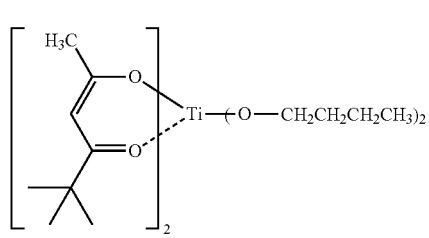
MC-4

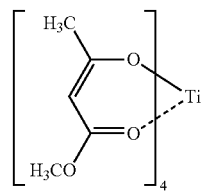
MC-5

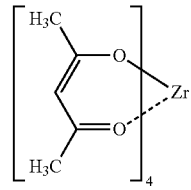
MC-6

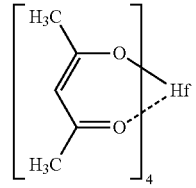
MC-7

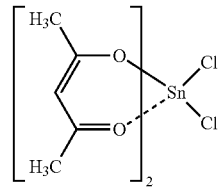
MC-8

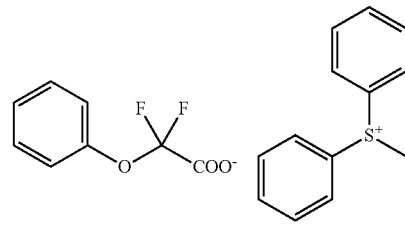
PAG-1

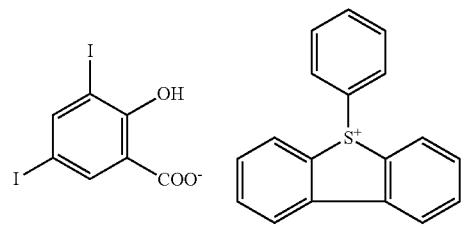
PAG-2

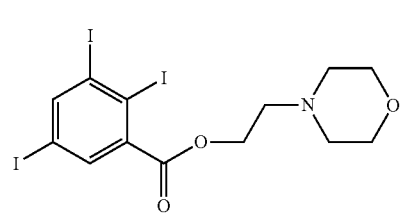
Base-1

Base-2

Synthesis Example of Metal Compound iii

Synthesis Example A-1

In 500 g of 1-butanol, 340 g of titanium tetrabutoxide was dissolved, and a mixed solution of 27 g of deionized water and 500 g of 1-butanol was dropped in at room temperature over 2 hours while stirring. To the obtained solution, 1,200 g of propylene glycol monomethyl ether acetate (PGMEA) was added, and this was heated at 50° C. under reduced pressure until the 1-butanol distillate was not obtained to afford 1,000 g of a solution of a titanium-containing compound [A-1] in PGMEA. The molecular weight thereof was measured in terms of polystyrene to find that Mw=1,050.

Synthesis Example A-2

In 500 g of 2-propanol (IPA), 284 g of titanium tetraisopropoxide was dissolved, and a mixed solution of 27 g of deionized water and 500 g of IPA was dropped in at room temperature over 2 hours while stirring. To the obtained solution, 146 g of 2-ethyl-1,3-hexanediol was added, and this was stirred at room temperature for 30 minutes. This solution was concentrated at 30° C. under reduced pressure, then was further heated to 60° C., and kept heated under reduced pressure until a distillate was not obtained. After the distillate was not observed, 1,200 g of 2-heptanone (MAK) was added, and this was heated at 40° C. under reduced pressure until the IPA distillate was not obtained to afford 1,000 g of a solution of a titanium-containing compound [A-2] in MAK. The molecular weight thereof was measured in terms of polystyrene to find that Mw=1,020.

Synthesis Example A-3

In 500 g of IPA, 284 g of titanium tetraisopropoxide was dissolved, and a mixed solution of 27 g of deionized water and 500 g of IPA was dropped in at room temperature over 2 hours while stirring. To the obtained solution, 120 g of 2-methyl-2,4-pentanediol was added, and this was stirred at room temperature for 30 minutes. This solution was concentrated at 30° C. under reduced pressure, then was further heated to 60° C., and kept heated under reduced pressure until a distillate was not obtained. After the distillate was not observed, 1,200 g of 2-heptanone (MAK) was added, and this was heated at 40° C. under reduced pressure until the IPA distillate was not obtained to afford 1,100 g of a solution of a titanium-containing compound [A-3] in MAK. The molecular weight thereof was measured in terms of polystyrene to find that Mw=950.

Synthesis Example A-4

In 500 g of 1-butanol, 243 g of titanium tetrabutoxide tetramer obtained by partial hydrolysis of titanium tetrabutoxide was dissolved, 130 g of pinacol was added, and this was stirred at room temperature for 30 minutes. This solution was concentrated at 40° C. under reduced pressure, then was further heated to 60° C., and kept heated under reduced pressure until a distillate was not obtained. After the distillate was not observed, 1,200 g of PGMEA was added, and this was heated at 50° C. under reduced pressure until the 1-butanol distillate was not obtained to afford 1,000 g of a solution of a titanium-containing compound [A-4] in PGMEA. The molecular weight thereof was measured in terms of polystyrene to find that Mw=1,150.

Synthesis Example A-5

In 500 g of 1-butanol, 243 g of the above-described titanium tetrabutoxide tetramer was dissolved, 150 g of 2,5-dimethyl-2,5-hexanediol was added, and this was stirred at room temperature for 30 minutes. This solution was concentrated at 50° C. under reduced pressure, then was further heated to 60° C., and kept heated under reduced pressure until a distillate was not obtained. After the distillate was not observed, 1,200 g of 2-heptanone (MAK) was added, and this was heated at 50° C. under reduced pressure until the 1-butanol distillate was not obtained to afford 1,000 g of a solution of a titanium-containing compound [A-5] in MAK. The molecular weight thereof was measured in terms of polystyrene to find that Mw=1,280.

Synthesis Example A-6

In 400 g of 1-butanol, 480 g of an 80 mass % solution of zirconium tetraisopropoxide in 1-butanol was dissolved, and a mixed solution of 27 g of deionized water and 500 g of 1-butanol was dropped in at room temperature over 2 hours while stirring. To the obtained solution, 90 g of 1,3-butanediol was added, and this was stirred at room temperature for 30 minutes. This solution was concentrated at 30° C. under reduced pressure, then was further heated to 60° C., and kept heated under reduced pressure until a distillate was not obtained. After the distillate was not observed, 1,200 g of PGMEA was added, and this was heated at 40° C. under reduced pressure until the 1-butanol distillate was not obtained to afford 1,000 g of a solution of a zirconium-containing compound [A-6] in PGMEA. The molecular weight thereof was measured in terms of polystyrene to find that Mw=1,400.

Synthesis Example A-7

In 400 g of 1-butanol, 480 g of an 80 mass % solution of hafnium tetraisopropoxide in 1-butanol was dissolved, and a mixed solution of 27 g of deionized water and 500 g of 1-butanol was dropped in at room temperature over 2 hours while stirring. To the obtained solution, 90 g of 1,3-butanediol was added, and this was stirred at room temperature for 30 minutes. This solution was concentrated at 30° C. under reduced pressure, then was further heated to 60° C., and kept heated under reduced pressure until a distillate was not obtained. After the distillate was not observed, 1,200 g of PGMEA was added, and this was heated at 40° C. under reduced pressure until the 1-butanol distillate was not obtained to afford 1,000 g of a solution of a hafnium-containing compound [A-7] in PGMEA. The molecular weight thereof was measured in terms of polystyrene to find that Mw=1,500.

TABLE 1

| Resist name | Metal compound i (parts by mass) | Metal compound iii (parts by mass) | Photo-acid generator (parts by mass) | Base compound (parts by mass) | Solvent (parts by mass) |
|---|---|---|---|---|---|
| Resist 1 | MC-1(10) | A-1(90) | — | — | PGMEA (6000) |
| Resist 2 | MC-2(10) | A-2(90) | — | — | MAK (6000) |
| Resist 3 | MC-2(10) | A-2(90) | PAG-1(5) | — | MAK (6000) |

TABLE 1-continued

| Resist name | Metal compound i (parts by mass) | Metal compound iii (parts by mass) | Photo-acid generator (parts by mass) | Base compound (parts by mass) | Solvent (parts by mass) |
|---|---|---|---|---|---|
| Resist 4 | MC-3(20) | A-2(80) | PAG-1(5) | Base-1(2) | MAK (6000) |
| Resist 5 | MC-4(30) | A-3(70) | PAG-2(10) | Base-1(2) | MAK (6000) |
| Resist 6 | MC-5(30) | A-3(70) | PAG-2(10) | Base-2(2) | MAK (6000) |
| Resist 7 | MC-6(20) | A-3(80) | PAG-2(10) | Base-2(2) | MAK (6000) |
| Resist 8 | MC-7(20) | A-4(80) | PAG-1(5) | Base-1(2) | PGMEA (6000) |
| Resist 9 | MC-8(10) | A-4(90) | PAG-2(10) | Base-1(2) | PGMEA (6000) |
| Resist 10 | MC-1(10) | A-5(90) | PAG-2(10) | Base-2(2) | MAK (6000) |
| Resist 11 | MC-2(20) | A-5(80) | PAG-2(10) | Base-2(2) | MAK (6000) |
| Resist 12 | MC-2(20) | A-6(80) | PAG-2(10) | Base-2(2) | PGMEA (6000) |
| Resist 13 | MC-2(20) | A-7(80) | PAG-2(10) | Base-2(2) | PGMEA (6000) |
| Resist 14 | — | A-1(100) | — | — | MAK (6000) |
| Resist 15 | — | A-2(100) | — | — | MAK (6000) |
| Resist 16 | — | A-2(100) | PAG-1(5) | Base-1(2) | MAK (6000) |
| Resist 17 | — | A-3(100) | PAG-2(10) | Base-1(2) | MAK (6000) |

In Table 1, resists 1 to 13 correspond to resist materials according to the present invention, and resists 14 to 17 are resist materials not according to the present invention, and are used in the Comparative Examples.

Electron Beam Drawing Evaluation

In an electron beam (EB) drawing evaluation, each of the resist materials 1 to 17 was spin-coated onto an Si substrate with a diameter of 8 inches (200 mm) treated with hexamethyldisilazane (HMDS) vapor prime using Clean Track Act-8 (manufactured by Tokyo Electron Limited.) and pre-baked on a hot plate at 170° C. for 60 seconds to prepare a 35-nm resist film. This was subjected to drawing in a vacuum chamber with an HV voltage of 125 kV using ELS-F125 manufactured by Elionix Inc. Then, using a Clean Track Act-8 (manufactured by Tokyo Electron Limited.) immediately after drawing, after baking at 170° C. for 60 seconds on a hot plate, paddle development was performed with an organic solvent developer for 30 seconds to obtain a negative pattern.

The obtained resist patterns were evaluated as follows. The exposure dose to resolve a 60 nm line/120 nm pitch (that is, a 60 nm 1:1 line-and-space) was defined as the optimum exposure dose (μC), and a half value (half pitch) of the minimum pitch size that is resolved at the optimum exposure dose was defined as resolution (nm). The optimum exposure dose preferably has a smaller value since this signifies a higher sensitivity, and the resolution also preferably has a smaller value since this signifies a higher resolution. In addition, patterning was performed with the exposure dose varied to determine the minimum trench size at which the trenches are separately resolved without bridging on a high-exposure-dose side, and this was defined as a trench resolution (nm). A smaller value is preferable since a high ability to form fine trenches is indicated. The organic solvent developer used for developing each resist material and the evaluation results (optimum exposure dose, resolution, and trench resolution) are shown in Table 2.

Note that the developers in the following Table 2 are as follows.
nBA: butyl acetate
MAK: 2-heptanone

TABLE 2

| | Resist name | Developer | Optimum exposure dose (μC) | L/S resolution (nm) | Trench resolution (nm) |
|---|---|---|---|---|---|
| Example 1 | Resist 1 | nBA | 450 | 25 | 20 |
| Example 2 | Resist 2 | nBA | 450 | 25 | 19 |
| Example 3 | Resist 3 | nBA | 300 | 24 | 19 |
| Example 4 | Resist 4 | nBA | 350 | 23 | 16 |
| Example 5 | Resist 5 | MAK | 400 | 23 | 18 |
| Example 6 | Resist 6 | MAK | 400 | 22 | 18 |
| Example 7 | Resist 7 | MAK | 450 | 22 | 17 |
| Example 8 | Resist 8 | MAK | 350 | 23 | 19 |
| Example 9 | Resist 9 | MAK | 400 | 23 | 18 |
| Example 10 | Resist 10 | MAK | 350 | 22 | 16 |
| Example 11 | Resist 11 | nBA | 400 | 23 | 18 |
| Example 12 | Resist 12 | nBA | 400 | 23 | 17 |
| Example 13 | Resist 13 | nBA | 450 | 23 | 19 |
| Comparative Example 1 | Resist 14 | nBA | — | 60 nm not resolved | — |
| Comparative Example 2 | Resist 15 | MAK | 900 | 60 | 48 |
| Comparative Example 3 | Resist 16 | MAK | 450 | 40 | 30 |
| Comparative Example 4 | Resist 17 | MAK | 600 | 30 | 28 |

It was observed from the results in Table 2 that the inventive resist materials had high resolution, and were particularly advantageous in forming fine trench patterns. In addition, sensitivity was high.

On the other hand, in Comparative Examples 1 and 2, where the component (i) was not contained, favorable results as in the Examples were not achieved. Meanwhile, in Comparative Examples 3 and 4, sensitivity was raised since the photo-acid generator of the component (iv) was added, but because the component (i) was not contained, sufficient resolution was still not achieved, and the trench resolution resulted in degradation.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

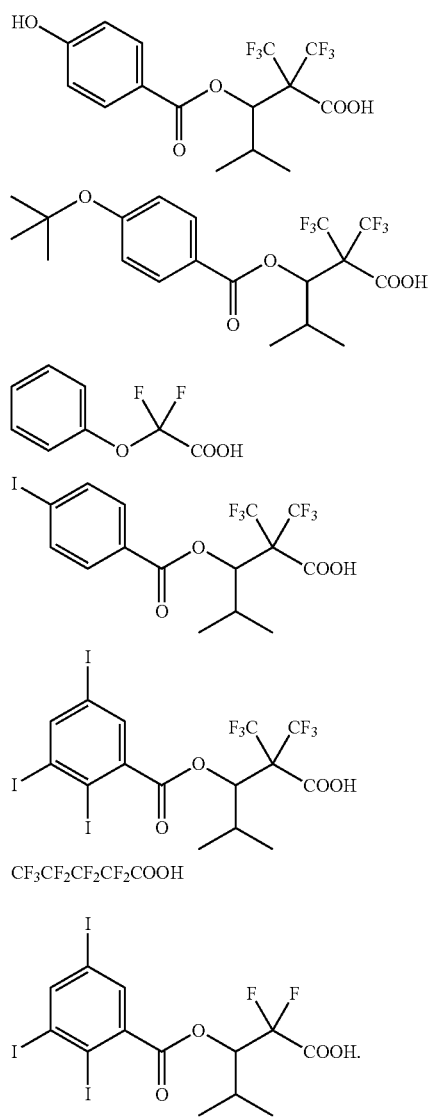
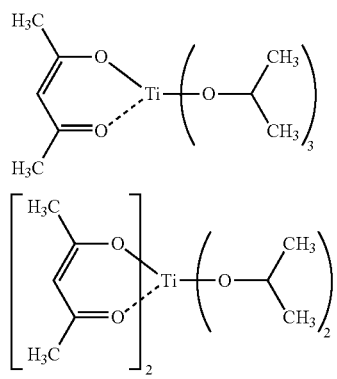
9. The resist material according to claim 1, wherein the component (i) is a metal compound shown by any of the following formulae (T4) to (T6):
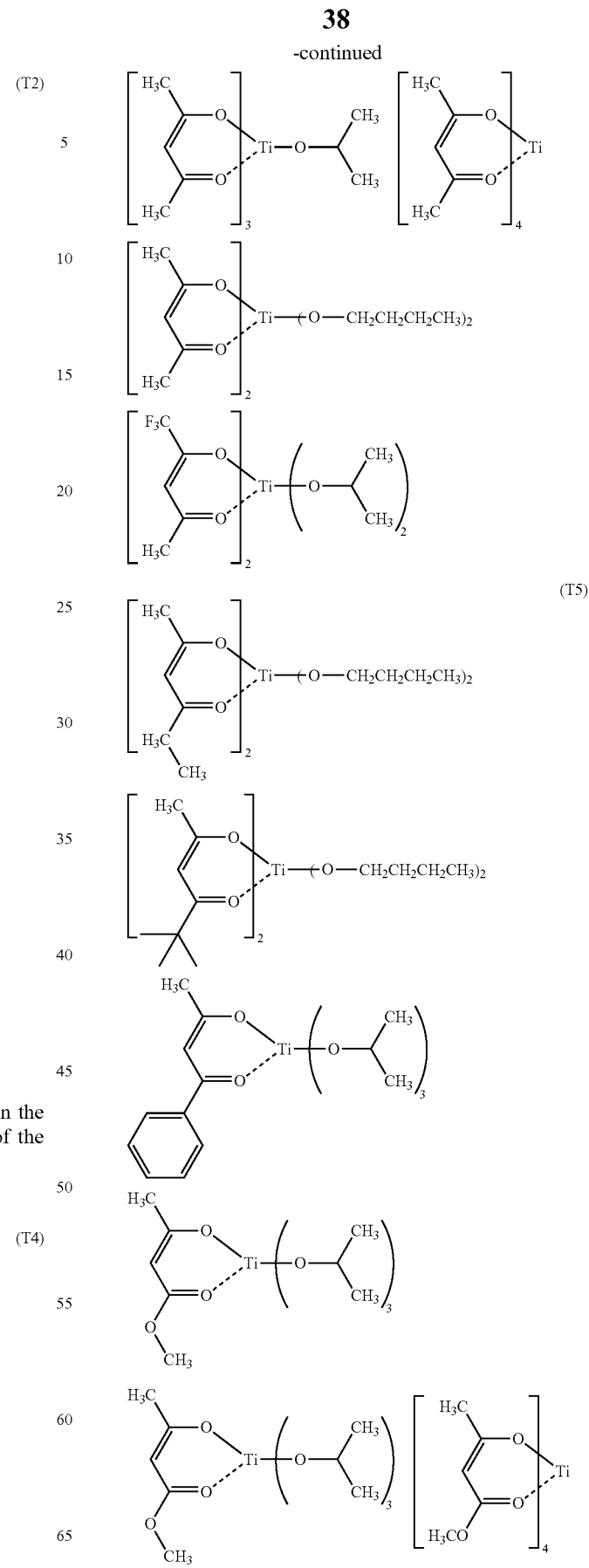

-continued
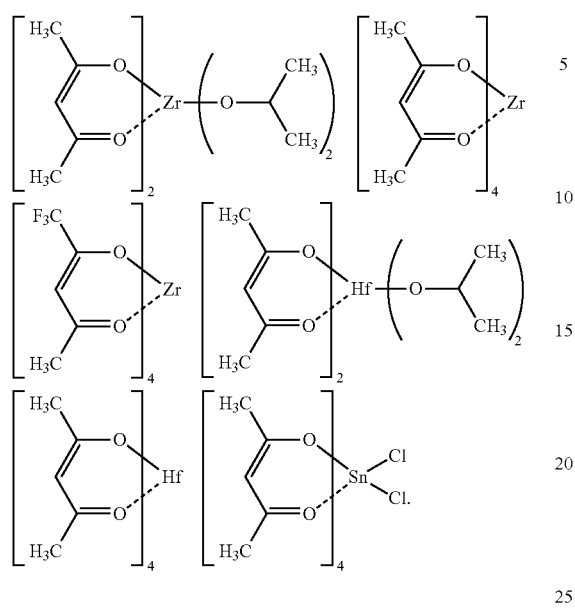

The invention claimed is:
1. A resist material comprising:
(i) a metal compound shown by the following general formula (M-1) and (ii) an organic solvent,

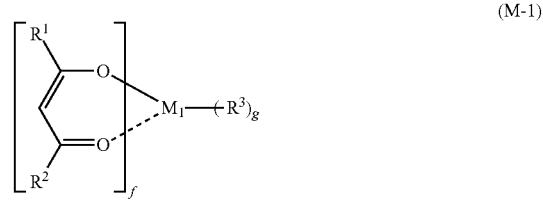

(M-1)

wherein M₁ represents an element selected from titanium, zirconium, hafnium, and tin; $R^1$ and $R^2$ each independently represents a linear or branched alkyl group or alkoxy group having 1 to 6 carbon atoms or an aryl group having 6 to 20 carbon atoms, and one or more hydrogen atoms are optionally substituted with a halogen atom; $R^3$ represents a halogen atom or a linear or branched alkyl group or alkoxy group having 1 to 6 carbon atoms; and "f" represents 1 to 4 and "g" represents 0 to 3, where f+g=4, further comprising:

(iii) a reaction product of a (partial) condensate or a (partial) hydrolysis-condensate of a metal compound shown by the following general formula (A-1) and a dihydric or trihydric alcohol shown by the following general formula (A-2), $$M_2(OR^{14})_4 \quad (A-1)$$

wherein M₂ represents an element selected from titanium, zirconium, and hafnium; and $R^{14}$ represents a linear or branched alkyl group having 1 to 12 carbon atoms; and $$R^{24}(OH)_m \quad (A-2)$$

wherein "m" represents 2 or 3; when "m" represents 2, $R^{24}$ represents a divalent group selected from a substituted or unsubstituted, linear, branched, or cyclic alkylene group, alkenylene group, alkynylene group, or aralkylene group having 2 to 20 carbon atoms optionally including an ester bond or ether bond; when "m" represents 3, $R^{24}$ represents a trivalent group, which is the divalent group having one hydrogen atom removed, wherein the proportion of the component (i) to the total amount of the component (i) and the component (iii) is 5 to 80 mass %, further comprising (iv) a photo-acid generator, wherein the component (iv) is a compound that generates a carboxylic acid shown by the following general formula (B-3) or (B-4),

(B-3)

wherein $R^9$ represents a linear, branched, or cyclic alkyl group, alkenyl group, or oxoalkyl group having 5 to 20 carbon atoms optionally including an ester bond or ether bond, or an aryl group, aralkyl group, or aryloxoalkyl group having 6 to 20 carbon atoms, and one or more hydrogen atoms are optionally substituted with a halogen atom, hydroxy group, carboxy group, or amino group; furthermore, $R^9$ optionally represents a hydroxy group; $Rf^1$ and $Rf^2$ each independently represents a fluorine atom or trifluoromethyl group; and

(B-4)

wherein $R^{10}$ to $R^{12}$ each independently represents a halogen atom, hydroxy group, carboxy group, substituted or unsubstituted, linear, branched, or cyclic alkyl group, alkenyl group, alkoxy group, alkoxycarbonyl group, or alkylcarbonyloxy group having 1 to 10 carbon atoms; and j, k, and p each independently represents 0 to 5, where j+k+p≤5, and further comprising (v) a basic compound, wherein the component (v) is a nitrogen-containing compound, wherein the blended amount of the component (iv) is 0.5 to 30 parts by mass relative to 100 parts by mass of the total amount of the component (i) and the component (iii), and wherein the resist material is a negative type resist material.

2. A patterning process comprising the steps of: coating a substrate with the resist material according to claim 1 (s1), performing a heat treatment (s2), exposing with a high-energy beam (s3), and developing using a developer (s4).

3. The patterning process according to claim 2, wherein the developer contains 60 mass % or more, based on a total amount of the developer, of one or more types of organic solvents selected from 2-octanone, 2-nonanone, 2-heptanone, 3-heptanone, 4-heptanone, 2-hexanone, 3-hexanone, diisobutyl ketone, 2-methyl cyclohexanone, 3-methyl cyclohexanone, 4-methyl cyclohexanone, acetophenone, 2'-methylacetophenone, 4'-methylacetophenone, butyl acetate, isobutyl acetate, amyl acetate, isoamyl acetate, phenyl acetate, methyl valerate, methyl 2-hydroxyisobutyrate, ethyl 2-hydroxyisobutyrate, methyl benzoate, ethyl benzoate, benzyl acetate, methyl phenylacetate, and methyl 3-phenylpropionate.

4. The patterning process according to claim 2, wherein a vacuum ultraviolet ray with a wavelength of 3 to 15 nm or an acceleration voltage electron beam with an acceleration voltage of 1 to 250 kV is used as a light source in the step (s3).

5. The resist material according to claim 1, wherein the proportion of the component (i) to the total amount of the component (i) and the component (iii) is 10 to 60 mass %.

6. The resist material according to claim 1, wherein the proportion of the component (i) to the total amount of the component (i) and the component (iii) is 10 to 30 mass %.

7. The resist material according to claim 1, wherein in the general formula (M-1), M₁ represents an element selected from titanium and tin.

8. The resist material according to claim 1, wherein the component (iv) is a compound that generates a carboxylic acid shown by any of the following formula (T1), the following formula (T2), and general formula (B-4):

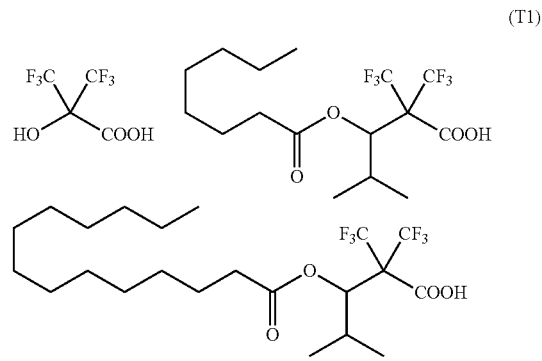
(T1)